(12) United States Patent
Sartore

(10) Patent No.: US 9,013,946 B2
(45) Date of Patent: Apr. 21, 2015

(54) APPARATUS AND METHOD TO MANAGE ENERGY CAPACITY OF A BACKUP POWER SUPPLY

(71) Applicant: AgigA Tech Inc., San Diego, CA (US)

(72) Inventor: Ronald H. Sartore, Poway, CA (US)

(73) Assignee: AgigA Tech Inc., San Diego, CA (US)

( * ) Notice: Subject to any disclaimer, the term of this patent is extended or adjusted under 35 U.S.C. 154(b) by 0 days.

(21) Appl. No.: 13/740,522

(22) Filed: Jan. 14, 2013

(65) Prior Publication Data

US 2013/0229880 A1 Sep. 5, 2013

Related U.S. Application Data

(60) Provisional application No. 61/586,089, filed on Jan. 12, 2012.

(51) Int. Cl.
*G11C 7/06* (2006.01)
*G11C 7/00* (2006.01)
*G11C 5/14* (2006.01)
*G11C 14/00* (2006.01)
*G11C 16/30* (2006.01)

(52) U.S. Cl.
CPC ........ *G11C 7/00* (2013.01); *G11C 5/145* (2013.01); *G11C 5/141* (2013.01); *G11C 14/0018* (2013.01); *G11C 16/30* (2013.01)

(58) Field of Classification Search
CPC ...... G11C 6/141; G11C 14/0018; G11C 16/30
USPC ............................................. 365/189.07, 227
See application file for complete search history.

(56) References Cited

U.S. PATENT DOCUMENTS

2009/0235038 A1* 9/2009 Sartore .................... 711/162
2010/0332858 A1* 12/2010 Trantham et al. ......... 713/300

* cited by examiner

*Primary Examiner* — Anthan Tran

(57) ABSTRACT

A memory module includes volatile memory and non-volatile memory. The module includes logic to check if a non-volatile memory comprises un-erased areas, and if the non-volatile memory comprises un-erased areas, to elevate a backup capacitor potential above a predetermined operating potential sufficient to power a backup of a volatile memory to the non-volatile memory. The module includes logic to ERASE the un-erased areas and to return the capacitor to the predetermined operating potential after the ERASE is complete.

18 Claims, 6 Drawing Sheets

APPARATUS AND METHOD TO MANAGE ENERGY CAPACITY OF A BACKUP POWER SUPPLY

PRIORITY

This application claims priority under 35 U.S.C. 119 to application No. U.S. 61/586,089, filed on Jan. 12, 2012, and which is incorporated herein by reference in its entirety.

BACKGROUND

Many electronic systems require protection from unexpected interruption of power. These systems typically employ batteries as a source of backup power, but batteries have certain disadvantages. These disadvantages include long charge time and limited recharge cycles. If the backup power is required for only a short time, a power source may be constructed using capacitors, such as Electrochemical Dual-Layer Capacitors, often named "Ultracapacitors" or "Supercapacitors". These capacitors employ electrostatic charge separation instead of the chemical reaction which is the basis for battery operation. This gives Ultracapacitors very high (500,000+) charge cycles, quick charge times, and the ability to deliver substantial power in a small volume.

DETAILED DESCRIPTION

Preliminaries

Figure 1:
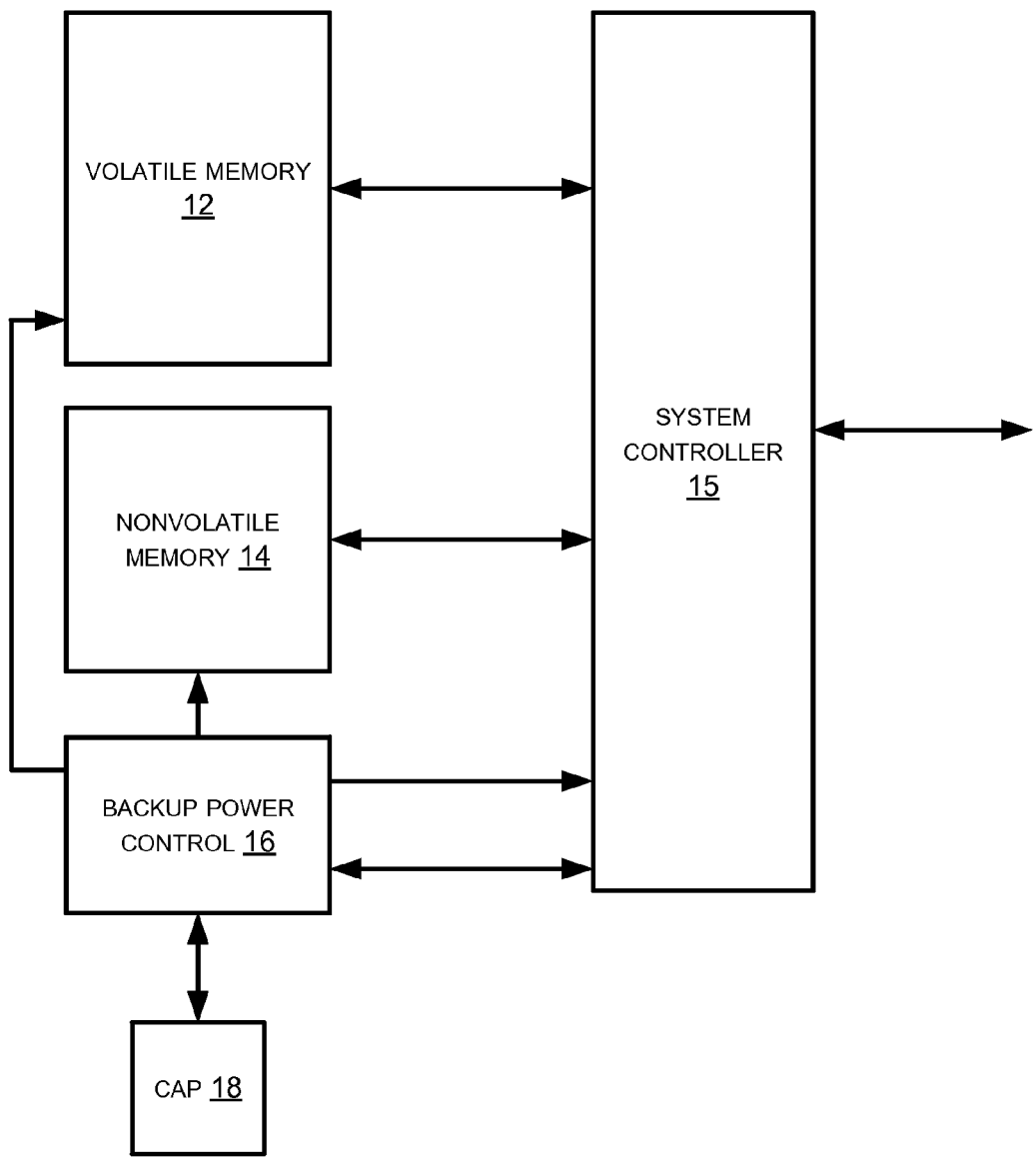
FIG. 1 illustrates an embodiment of a memory system employing a capacitor-based backup power source.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application.

"Logic" refers to machine memory circuits, tangible machine readable media, and/or circuitry which by way of its material and/or material-energy configuration comprises control and/or procedural signals, and/or settings and values, that may be applied to influence the operation of a device. Magnetic tangible media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more devices and/or "chips", circuits, etc. The particular distribution and choice of logic is a design decision that will vary according to implementation.

Overview

A memory controller state indicates the presence or not of data in a nonvolatile memory. In particular, the data may be data backed up from a volatile memory. If the data is present in the nonvolatile memory, the operating potential of a capacitive backup power supply is elevated above an upper predetermined operating potential of the capacitor. The nonvolatile memory is not enabled as a backup memory for the volatile memory until the capacitor potential reaches this elevated level. This may mean that the volatile memory is not made available for writing of data until the capacitor reaches the elevated potential, even though primary power exists to power the backup, and even though the capacitor holds enough charge to complete a full backup of the volatile memory to the nonvolatile memory should primary power fail. Once the capacitor reaches the elevated potential, the nonvolatile memory is enabled for use as a backup memory for the volatile memory. The volatile memory may be made available for writing at this point as well. An ERASE may then performed on the nonvolatile memory, typically using energy from a primary (not the backup capacitive) power source. The backup capacitive power source may instead be used to power the ERASE, even though the primary power is available. Once the ERASE is complete, the capacitor is discharged down to its upper predetermined operating potential and maintained at that level, while the system is operated using primary power.

Detailed Description of Particular Embodiments

FIG. 1 illustrates a memory system utilizing a capacitor-based backup power supply. The system includes a low-cost volatile memory 12 in conjunction with a low-cost non-volatile memory 14. Example memory technologies that may be utilized include SDRAM (volatile memory 12) and NAND FLASH (nonvolatile memory 14). The system further includes backup power control circuitry 16, power capacitor(s) 18, and a system controller 15. Other elements and/or couplings among the elements may be apparent to skilled practitioners in the relevant art(s).

The power control circuitry 16 interfaces the memory subsystem to an external power source, typically the power source of a larger system that incorporates and uses the memory subsystem. For example, the external power source may be the power of personal or business computer system (the "host" system) that incorporates the memory subsystem. The power control circuitry 16 also interfaces the memory subsystem to a backup power source that is local to the memory subsystem. The backup power source may be, for example, one or more capacitors 18. In the embodiment of FIG. 1, capacitor(s) 18 provides power to the memory subsystem for a temporary time when external power fails. The capacitor 18 may provide power for long enough to copy data blocks from volatile memory 12 to nonvolatile memory 14.

In the event of an external power failure, the memory subsystem may operate as an isolated subsystem of the larger, external system (the host system). The power circuitry 16 may recognize that external system power has failed. The system controller 15 may then initiate backup of data currently stored in the volatile memory 12 into the non-volatile memory 14. Herein, the term "backup" means that data of the volatile memory 12 is stored into the nonvolatile memory 14. Upon restoration of external system power, the system controller 15 may initiate restoration of backed-up data from non-volatile memory 14 to volatile memory 12. Herein, the term "restore" and "restoration" means that data of the non-volatile memory 14 is stored into the volatile memory 12.

The system controller 15 may thus include logic to backup data from volatile memory 12 to nonvolatile memory 14 when the external power source fails, and to restore data from nonvolatile memory 14 to volatile memory 12 when the external power source becomes available. Those skilled in the art will appreciate that various functional components, such as the power controller logic 16 and the system controller logic 15, and even the volatile memory 12 and nonvolatile memory 14, may in fact be implemented together as one or more integrated circuit devices, or packaged as one or more discrete physical components.

Data stored within the memory subsystem persists even when the power of the external system fails. The external system may interact with the memory subsystem as though interacting with volatile memory 12 (of the same or another type), even though, transparently, the data is stored internally by the memory subsystem in nonvolatile memory 14 persistently in the absence of external system power.

The memory system may write data to non-volatile memory 14 only in the event that external system power fails. Thus, the non-volatile memory 14 undergoes many fewer write cycles than would occur if it were being written every time data were written to the memory subsystem. When the non-volatile memory 14 is a low-cost, limited duty cycle NAND FLASH, the result in an extension of the useful lifetime of the non-volatile memory 14.

The system controller 15 provides a memory interface to the external system. The memory interface may comprise a standard data and control interface for some particular kind of volatile memory. For example, the system controller may provide an SDRAM data, address, and control interface to the external system. The interface provided to the external system may or may not be the interface for the type of volatile memory 12 actually used by the memory subsystem.

The system controller 15 may additionally provide an interface whereby the external system may send commands to the memory subsystem or obtain status. For example, in some embodiments the external system may command the memory subsystem to initiate a backup of data from volatile memory 12 to non-volatile memory 14, even though the system power is still available. Additionally or alternatively, the memory subsystem or external system may provide a direct user interface, such as a switch or control on a graphic user interface, whereby a user of the external system may directly initiate a copy of data from volatile 12 to non-volatile memory 14. Another action which may in some embodiments be initiated either through the system interface of the system controller 15, or directly by a user, is restoring data from non-volatile memory 14 to volatile memory 12. In some embodiments the external system may use its system interface to the memory controller 15 to initiate a self test of the memory subsystem.

Following a system power failure, at some later time the system power returns and the system may perform a data recovery operation. This involves instructing the memory module (e.g., controller 15) to perform a restore operation which copies the saved nonvolatile memory data back into the volatile memory from which it was copied during the backup operation. The system may then consult this image in order to complete whatever operations may have been required before the unexpected power failure. For example, if the memory module functions as a hard drive cache, the system may write the cache data to the hard drive(s).

Figure 2:
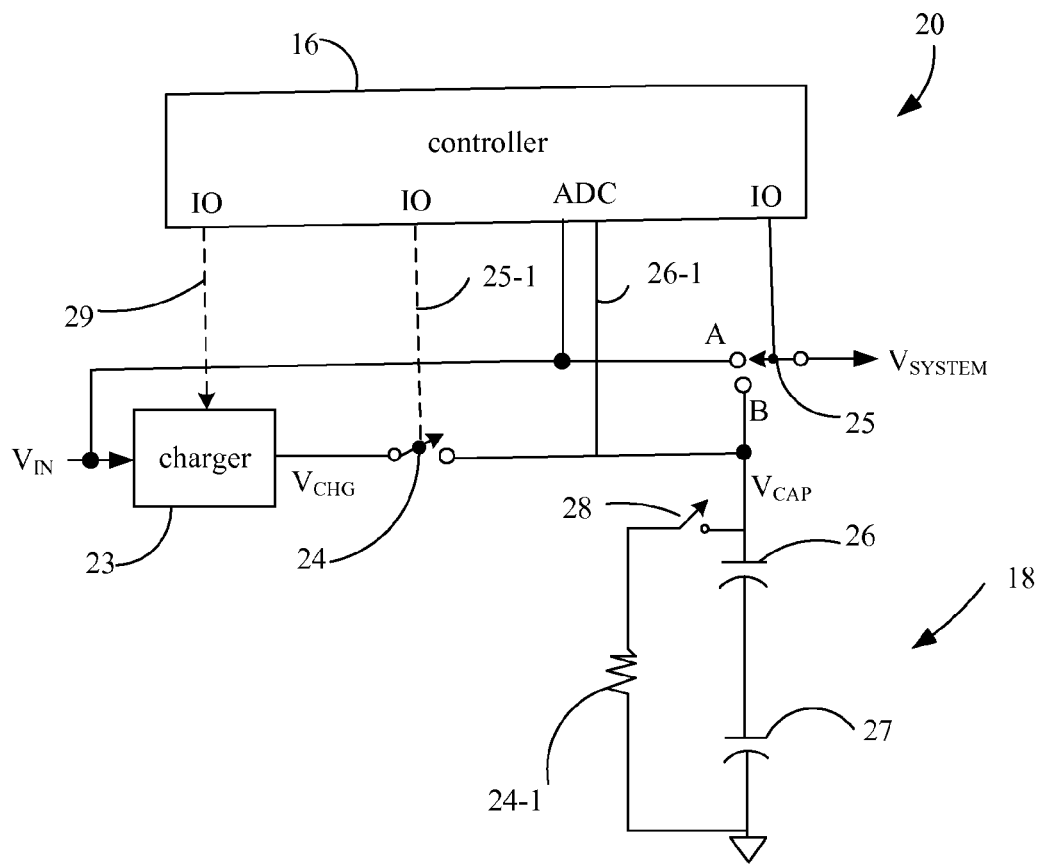
FIG. 2 illustrates an embodiment of capacitor charging logic.

FIG. 2 illustrates an embodiment of logic for charging a capacitor backup power source. Depending on the implementation, other elements may be present in the system, and would be readily understood to be present by those of skill in the relevant arts. System 20 comprises controller 16, charger 23, and a capacitor configuration 18. The capacitor configuration 18 comprises multiple capacitors 26-27 (e.g., multiple ultracapacitors coupled in series) to increase the operating voltage beyond that available from an individual capacitor (e.g., 2.5-2.7 volts for a single ultracapacitor). A typical backup power supply for a digital memory device may employ 2-6 ultracapacitors in series. Each series ultracapacitor may comprise a single ultracapacitor, or multiple ultracapacitors in parallel.

For example, a series configuration of four capacitors each rated at a maximum operating potential of 2.7V would have a combined maximum potential rating of 10.8V (4*2.7V), but the upper predetermined operation potential (the actual voltage at which the capacitor stack is maintained during system operation) of the combination will be lower, e.g. 8.0V.

The controller 16 directs the charger 23 to charge the capacitors 18. The controller 16 may activate and deactivate the charger 23 via switch 24 and I/O interface 25-1. In some implementations, the controller 16 may also direct the charger 21 via an I/O interface 29 to provide a particular charge voltage and/or charge current.

In operation, the system 20 receives primary power at $V_{IN}$, which may for example be 12V in digital memory systems. The controller 16 maintains switch 25 in the "A" position while $V_{IN}$ is available, providing the output voltage $V_{SYSTEM}$ directly from $V_{IN}$. The capacitors are charged and available as a backup supply should $V_{IN}$ fail.

The charger 23 is operated via switch 24 to charge the capacitors 18. Switch 24, like other switch elements, is illustrated as a discrete component but may be incorporated into the charger 23 or controller 16. After the capacitors 18 charge to their upper predetermined operating potential, the controller 16 disconnects the charger 23 by opening the switch 24.

Whenever $V_{CAP}$ diminishes by a preset amount below the upper predetermined operating potential of the capacitors 18, for example by 2%, the controller 16 may re-connect the charger 23 to "top off" the capacitors 18 to their upper predetermined operating potential.

When power $V_{IN}$ fails (e.g., becomes irregular, and/or falls below a lower acceptable limit), switch 25 is set to the "B" position. This powers the output voltage $V_{SYSTEM}$ from the capacitors 18.

The controller 16 may configure the charger 23 to output a particular charge voltage and/or charge current. The charger 23 may act as a "constant current source" that provides a constant amount of current even as the impedance of the capacitor changes as the stored potential rises. For example, if $V_{CAP}$ has a upper predetermined operating potential of 10V, the controller 16 might set the charger voltage at 11V and the charge current at 200 milliamps. The controller 16 may "top off" the capacitors as stored potential leaks away, as described previously.

Figure 3:
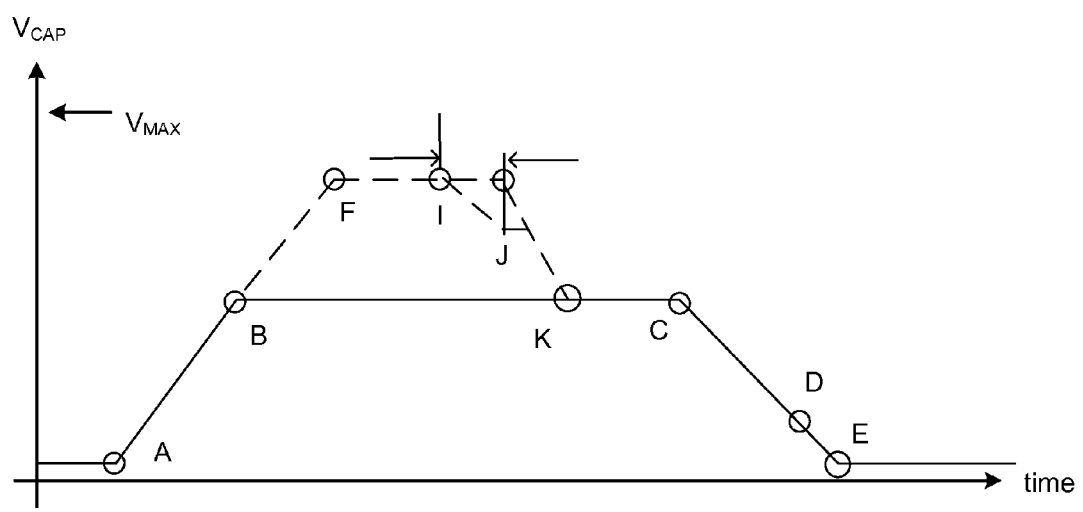
FIG. 3 illustrates an embodiment of transient elevation of a capacitor potential over an upper predetermined operating potential for the capacitor.

FIG. 3 illustrates an embodiment of transient elevation of a capacitor potential over an upper predetermined operating potential for the capacitor. System power is turned on at (A) and the ultracapacitor(s) begin to charge. At (B) the ultracapacitors 18 are charged to their predetermined upper operating potential. This is the voltage at which the ultracapacitors 18 are maintained while the system is operated from the primary power source. The upper predetermined operating potential is less than a maximum rated charge voltage Vmax for the ultracapacitors 18. At point (C) the primary system power fails and the ultracapacitors 18 begin to power the circuitry that transfers the volatile memory 12 data into the non-volatile memory 14. The power required for the data transfer drops the capacitor voltage Vcap from (C) to (D). The discharge logic (see FIG. 4) is then activated to drop Vcap further, to (E—which could be approximately 0V), and the system shuts down.

If, at system startup (defined as a time between when primary power is applied to power the system (A) and when Vcap reaches the maximum predetermined operating voltage (B)), a status indication in the memory controller 15 indicates that there is potentially useful data in the nonvolatile memory 14, the ultracapacitor(s) 18 are transiently charged to the voltage at (F). Otherwise, the ultracapacitors 18 are charged only to (B).

Between (F) and (I), the host system may examine, transfer, or otherwise operate on or in response to the data in the nonvolatile memory 14. At (I), the host system instructs the memory controller 15 to begin erasing the data in the non-volatile memory 15. Once the data is erased at (J), the ultra-capacitors 18 are discharged to their upper predetermined operating potential at (K).

Either primary power (preferred) or power from Vcap may be used to power the erasure of the data in nonvolatile memory 14. If power from Vcap is used, a decrease in Vcap voltage may take place between (I) and (J). Otherwise, Vcap is not depleted between (I) and (J), or is depleted proportionally with the amount of data erased (using the discharge logic).

This approach may improve the reliability of data backup in the event of a primary system power failure, at the expense of some decrease in the overall operating lifetime of the ultracapacitors 18. The reduction of the ultracapacitor lifetime attributable to the temporary elevation of ultracapacitor voltage may be shown to be acceptably low.

The amount of ultracapacitor transient charge elevation is the area enclosed by the points (B)(F)(I)(J)(K)(B). Assume for analysis purposes that it takes one minute to charge the ultracapacitors 18 from (B) to (F), nine minutes for the system to deal with the restored non-volatile memory data (F) to (I), two minutes to erase the NV memory (I) to (J) and three minutes to discharge the ultracapacitors 18 to their working voltage (J) to (K). The amount of time the ultracapacitors 18 are above their working voltage is 1+9+2+3 or 15 minutes.

Further assuming the ultracapacitors 18 are specified for a five year lifetime, and during that period the system suffered unexpected power losses ten times per year, on average. The fifty backup/restore operations elevate the ultracapacitor voltage by 50*15 minutes, or 750 minutes. This represents 750/(5*365*24*60) or approximately 0.03% of the time that the ultracapacitors 18 have operated above their normal working voltage. The effect on ultracapacitor operating lifetime is thus acceptably low for most applications.

A transient elevation of the capacitor potential above the predetermined operating potential may be made when the contents of a nonvolatile memory 14 indicate the contents include data of potential application, for example data to be restored to the volatile memory 12. The nonvolatile memory 14 is not enabled as a backup memory for the volatile memory 12 until the capacitor potential reaches the elevated level. This may mean that the volatile memory 12 is not made available for writing of data until the capacitors 18 reach the elevated level, even though both primary power exists to power the backup and even though the capacitors 18 hold enough charge to power a full backup of volatile memory 12 to nonvolatile memory 14 should primary power fail. The capacitors 18 reach the elevated potential and the nonvolatile memory 14 is enabled for use as a backup memory for the volatile memory 12. The volatile memory 12 may be made available for writing at this point as well. An ERASE is then performed on the nonvolatile memory data, for example using energy from a primary (not the backup capacitor) power source. Or, the capacitors 18 may instead be used to power the ERASE, even though the primary power is available, thus facilitating the restoration of the capacitors 18 to the predetermined operation potential.

Once the ERASE is complete, the capacitors 18 are discharged down to their upper predetermined operating potential (possible by the ERASE operation itself) and maintained at that level during system operation using primary power.

The transient potential elevation above the upper predetermined operating potential may be set to fall below a maximum operating potential of the capacitors 18. This may be achieved by setting the upper predetermined operating potential of the capacitors 18 below a maximum operating potential for the capacitors 18. A peak potential reached during the transient elevation in potential may reach the maximum operating potential or may not reach this maximum level.

In one embodiment, the capacitor stored potential may be elevated above its upper predetermined operating potential less than 0.1% of its operating lifetime. In some designs, the capacitor stored potential may be elevated above its upper predetermined operating potential less than 0.05% of its operating lifetime.

Figure 4:
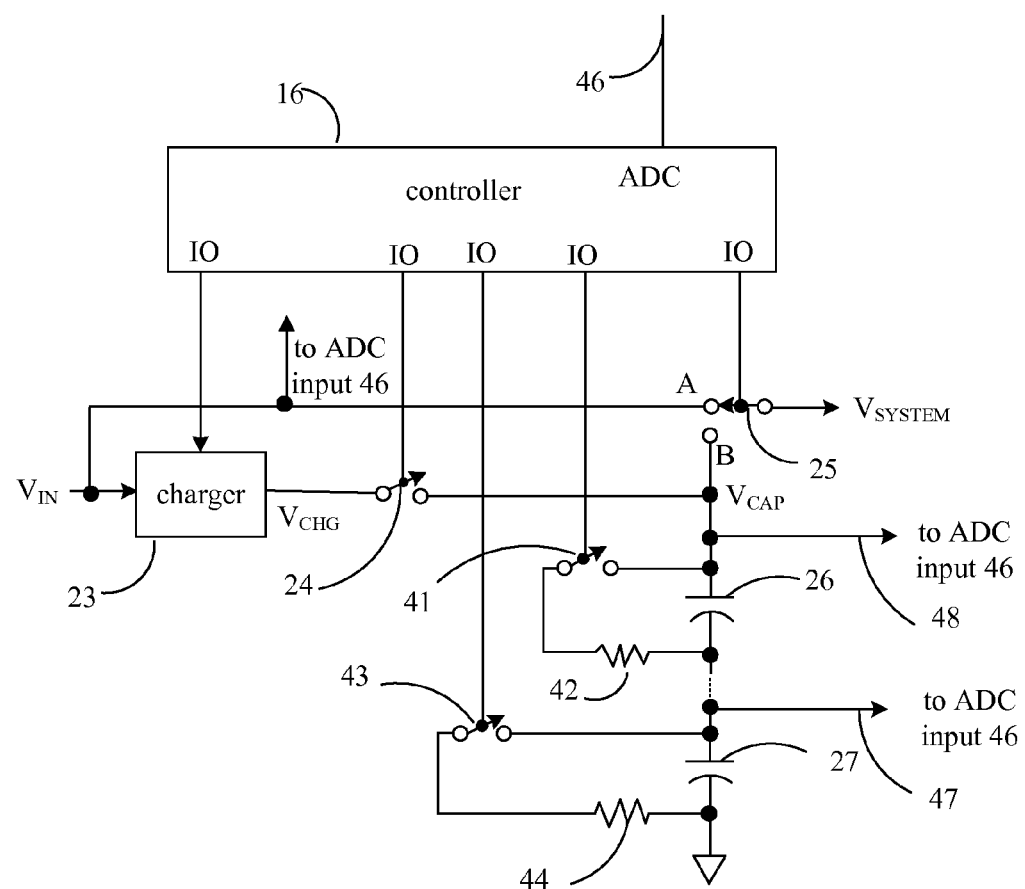
FIG. 4 illustrates an embodiment of a backup power source including logic to drain charge from individual capacitors.

FIG. 4 illustrates an embodiment of a backup power source including logic to individually discharge capacitors in a series arrangement. Discharge logic (41-42 and 43-44) is coupled to each capacitor 26-27 in a series arrangement. There may be more than two capacitors in series and each series capacitor may comprise two or more capacitors in parallel, with each parallel set in the series be associated with its own discharge logic. The controller 16 measures the stored potential of each capacitor 26-27 via interfaces 48 and 47. Not illustrated are scaling resistors that may reduce stored capacitor potentials to a range compatible with the controller ADC input 46, for example 3.3V maximum.

This arrangement or a similar one allows each capacitor 26-27 to be set to an individual operating potential even if the capacitance values of the capacitors in the series arrangement are mismatched (not the same). The ability to selectively discharge individual capacitors in a series may be also invoked during charging operations to maintain the capacitor stored potentials in balance (i.e., keep them substantially equal within tolerances of the implementation).

A mismatched series of capacitors (e.g., a series coupled string of capacitors) is vulnerable to "over-voltage" (a stored potential in excess of the capacitor's design limits) during charging with large currents, because lower value capacitors charge faster than higher value ones. All capacitors in a series configuration receive the same charge current (parallel capacitors split the provided charge current). Lower-capacitance capacitors reach a target stored potential (e.g., their upper predetermined operating potential) before higher-capacitance capacitors reach the same target potential. Charging higher-capacitance capacitors in a series configuration to a combined upper predetermined operating potential for the combination, may result in the lower-capacitance capacitors being individually over-charged (charged above their individual upper predetermined operating potential). To mitigate this effect, the individual capacitor discharge logic (41-42 and 43-44) may be employed to "balance" the capacitors' stored potential as they are charged.

The controller 16 may monitor each individual capacitor output potential during charging of the series configuration of capacitors 26-27. The controller 16 may determine which (if any) capacitors are approaching an unsafe (over-voltage) condition, and transiently switch on the discharge logic for at-risk capacitors to drain charge away from (and thus lower the stored potential of) these capacitor(s). By way of example, the discharge logic may comprise a MOSFET transistor in series with a resistor, or it may be only a MOSFET that is duty-cycle modulated by the controller 16 to time-average the discharge current.

The discharge logic may therefore function to (1) discharge the capacitors 26-27 after the capacitor stored potential is transiently elevated at startup, (2) balance the capacitors' stored charge during high-current charging to prevent an over-voltage condition, and (3) balance the capacitors' stored charge when differences in leakage currents result in mismatched stored potential for different capacitors. The discharge logic may also be employed to remove any residual charge on the capacitors 26-27 after a data backup operation.

Figure 5:
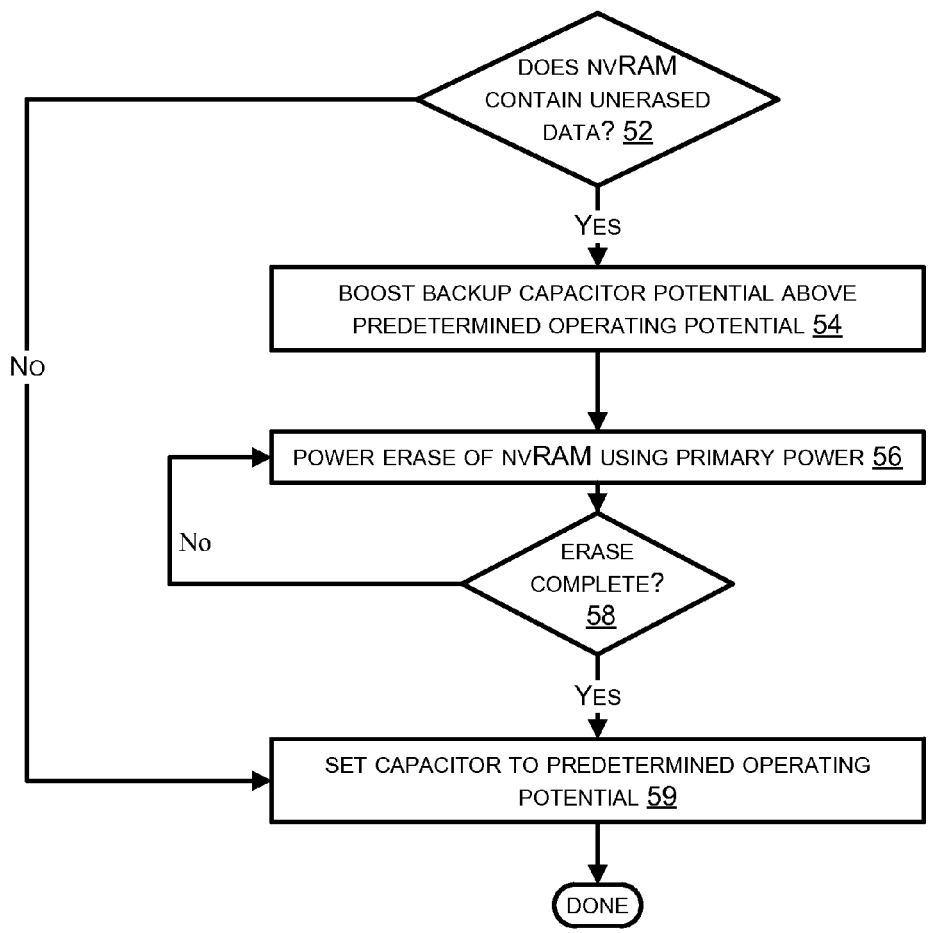
FIGS. 5 and 6 illustrate embodiments of a process of elevating backup power capacitor potential over a predetermined operating potential.
Figure 6:
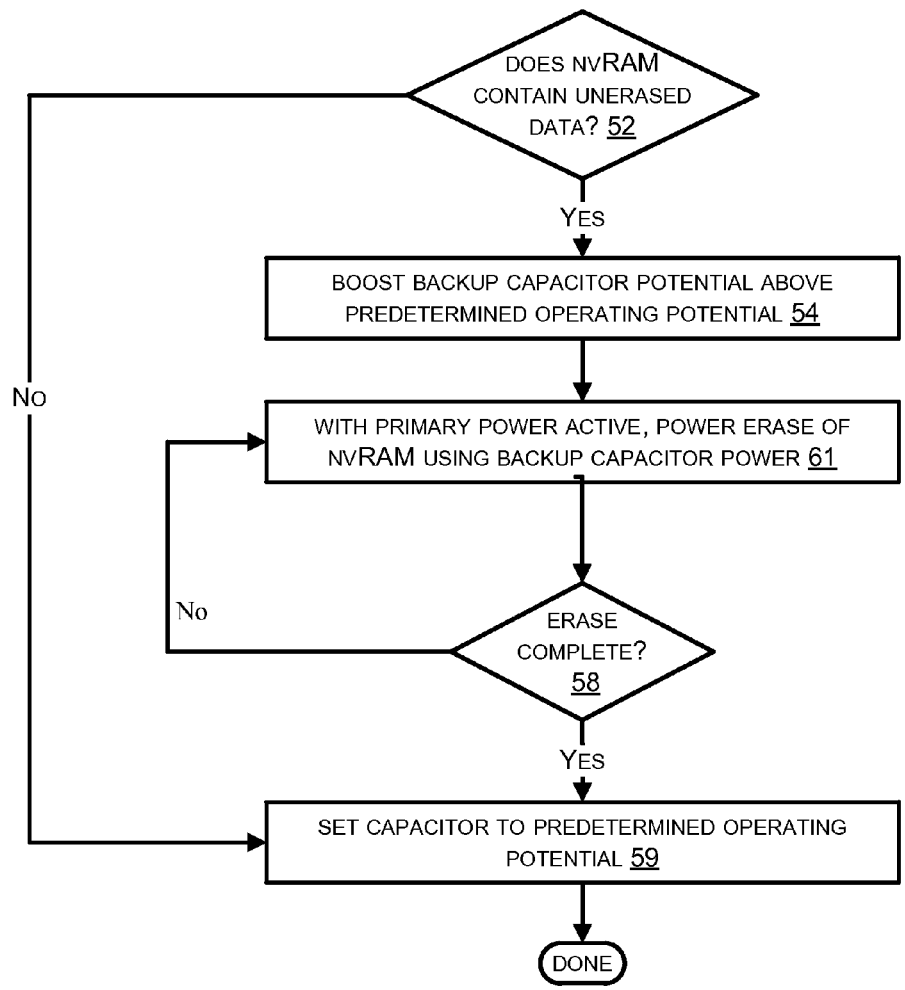

FIGS. 5 and 6 illustrate embodiments of a process of elevating backup power capacitor potential over a predetermined operating potential. The nonvolatile memory 14 is checked (52) for un-erased data, typically a backup or partial backup image of data in the volatile memory 12. The check may involve checking the state of a memory controller (e.g., 15 or 16) for a bit or bits indicating one or more backup images of the volatile memory 12, or partial backup data of the volatile memory 12, in the non-volatile memory 14. If the status indicates data in the non-volatile memory 14, the potential of one or more backup capacitors is elevated (54) above a predetermined operating potential, for example by an amount of 10-25%. The amount of the elevation may be proportional to a size (e.g., in bytes) of the un-erased portion of the non-volatile memory 14. An ERASE of the non-volatile memory 14 is then powered by primary power (56) (e.g., by power from the system external to the memory module). If the ERASE is complete (58), the potential of the capacitor(s) is lowered down to the predetermined operating potential (59), and maintained at that level during system operation. The capacitor operating potential is elevated despite the availability of primary power and despite using the primary power to power the ERASE. Alternatively, the ERASE may be powered by the capacitor(s) (61), even though primary power is available and even though backup power would not typically be used when primary power is available.

Other examples and/or embodiments of the various system components may now be apparent to skilled practitioners in the relevant art(s).

Implementations and Alternatives

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. tangible read/write volatile or non-volatile memory or media). "Firmware" refers to logic embodied as read-only tangible memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A process of managing a backup capacitor power source, the method comprising:
   checking if a non-volatile memory comprises un-erased areas;
   only if the non-volatile memory comprises un-erased areas, elevating a backup capacitor potential to and then beyond a first predetermined operating potential sufficient to power a backup of a volatile memory to the non-volatile memory, to a second predetermined operating potential exceeding the first predetermined operating potential;
   ERASING the un-erased areas; and
   returning the capacitor to the predetermined operating potential after the ERASE is complete.

2. The process of claim 1, further comprising:
   ERASING the un-erased areas, prior to returning the capacitor to the predetermined operating potential, using a primary power source for the volatile and non-volatile memories.

3. The process of claim 1, further comprising:
   ERASING the un-erased areas using the backup capacitor as a power source for the volatile and non-volatile memories while a primary power source for the volatile and non-volatile memories is available.

4. The process of claim 1, further comprising:
   inhibiting writing of data to the volatile memory until the capacitor reaches the elevated potential (a) while primary power is available and (b) after the capacitor reaches a sufficient charge to complete a full backup of the volatile memory to the nonvolatile memory.

5. The process of claim 1, wherein checking if the non-volatile memory comprises un-erased areas comprises checking if the non-volatile memory comprises data to restore to the volatile memory.

6. The process of claim 3, wherein returning the capacitor to the predetermined operating potential after the ERASE is complete further comprises powering the ERASE using the backup capacitor as a power source for the ERASE.

7. A memory device comprising:
   volatile memory;
   non-volatile memory; and
   logic to check if the non-volatile memory comprises un-erased areas, and only if the non-volatile memory comprises un-erased areas, elevating a backup capacitor potential to and then beyond a first predetermined operating potential sufficient to power a backup of a volatile memory to the non-volatile memory, to a second predetermined operating potential exceeding the first predetermined operating potential;
   logic to ERASE the un-erased areas; and
   logic to return the capacitor to the predetermined operating potential after the ERASE is complete.

8. The memory device of claim 7, further comprising:
   logic to ERASE the un-erased areas, prior to returning the capacitor to the predetermined operating potential, using a primary power source for the volatile and non-volatile memories.

9. The memory device of claim 7, further comprising:
   logic to ERASE the un-erased areas using the backup capacitor as a power source for the volatile and non-volatile memories while a primary power source for the volatile and non-volatile memories is available.

10. The memory device of claim 7, further comprising:
    logic to inhibit writing of data to the volatile memory until the capacitor reaches the elevated potential (a) while primary power is available to the volatile and nonvolatile memories and (b) after the capacitor reaches a sufficient charge to complete a full backup of the volatile memory to the nonvolatile memory.

11. The memory device of claim 7, wherein the logic to check if the non-volatile memory comprises un-erased areas comprises logic to check if the non-volatile memory comprises data to restore to the volatile memory.

12. The memory device of claim 11, wherein the logic to return the capacitor to the predetermined operating potential after the ERASE is complete further comprises logic to power the ERASE using the backup capacitor as a power source for the ERASE.

13. A controller device for a memory system, comprising:
    logic to check if a non-volatile memory comprises un-erased areas, and only if the non-volatile memory comprises un-erased areas, elevating a backup capacitor potential to and then beyond a first predetermined operating potential sufficient to power a backup of a volatile memory to the non-volatile memory, to a second predetermined operating potential exceeding the first predetermined operating potential;
    logic to ERASE the un-erased areas; and
    logic to return the capacitor to the predetermined operating potential after the ERASE is complete.

14. The controller device of claim 13, further comprising:
    logic to ERASE the un-erased areas, prior to returning the capacitor to the predetermined operating potential, using a primary power source for the volatile and non-volatile memories.

15. The controller device of claim 13, further comprising:
    logic to ERASE the un-erased areas using the backup capacitor as a power source for the volatile and non-volatile memories while a primary power source for the volatile and non-volatile memories is available.

16. The controller device of claim 13, further comprising:
    logic to inhibit writing of data to the volatile memory until the capacitor reaches the elevated potential (a) while primary power is available to the volatile and nonvolatile memories and (b) after the capacitor reaches a sufficient charge to complete a full backup of the volatile memory to the nonvolatile memory.

17. The controller device of claim 13, wherein the logic to check if the non-volatile memory comprises un-erased areas comprises logic to check if the non-volatile memory comprises data to restore to the volatile memory.

18. The controller device of claim 15, wherein the logic to return the capacitor to the predetermined operating potential after the ERASE is complete further comprises logic to power the ERASE using the backup capacitor as a power source for the ERASE.

* * * * *